US012664325B1

(12) United States Patent
Penrose et al.

(10) Patent No.: US 12,664,325 B1
(45) Date of Patent: Jun. 23, 2026

(54) CREATING VIRTUAL BOUNDARIES FOR MODELLING PATTERNED BOUNDARY CONDITIONS WITHIN SIMULATIONS

(71) Applicant: ANSYS, INC., Canonsburg, PA (US)

(72) Inventors: Justin Miles Tristan Penrose, Wantage (GB); Laith Zori, Clifton, VA (US); Juan Carlos Morales Rebellon, Tampa, FL (US); Thomas Gessner, Grantham, NH (US); Krishnan Hariharan, Pune (IN)

(73) Assignee: ANSYS, INC., Canonsburg, PA (US)

( * ) Notice: Subject to any disclaimer, the term of this patent is extended or adjusted under 35 U.S.C. 154(b) by 760 days.

(21) Appl. No.: 17/805,129

(22) Filed: Jun. 2, 2022

(51) Int. Cl.
*G06F 30/28* (2020.01)
*G06F 30/10* (2020.01)

(52) U.S. Cl.
CPC .............. *G06F 30/10* (2020.01); *G06F 30/28* (2020.01)

(58) Field of Classification Search
CPC ................................. G06F 30/10; G06F 30/28
See application file for complete search history.

(56) References Cited

U.S. PATENT DOCUMENTS

| | | | |
|---|---|---|---|
| 2006/0025976 A1* | 2/2006 | Kennon ................... | G06T 17/20 703/10 |
| 2012/0203512 A1* | 8/2012 | Shahpar ................... | G06T 17/20 703/1 |
| 2021/0056174 A1* | 2/2021 | Zhao ........................ | G06F 30/23 |
| 2024/0265171 A1* | 8/2024 | Mukherjee .............. | G06F 30/10 |

OTHER PUBLICATIONS

J. Rokicki et al, "Parallel overlapping-mesh algorithm," WIT Transactions on Information and Communication Technologies, vol. 23, pp. 10, Published 2000. DOI:10.2495/HPC000311 (Year: 2000).*
J. Huang et al., "Overlapping finite element meshes in AMORE," Advances in Engineering Software vol. 144, Jun. 2020 (Year: 2020).*
K. D. Brislaw et al., "Adaptively-Refined Overlapping Grids for the Numerical Solution of Systems of Hyperbolic Conservation Laws", published 1995 (Year: 1995).*
K. Lundström, "An overlapping mesh based splitting method for the incompressible Navier-Stokes equations," Umeå University, Faculty of Science and Technology, Department of Physics, published Nov. 2019. (Year: 2019).*
G. Chesshire et al., "A Scheme for Conservative Interpolation on Overlapping Grids" Siam J. Scl. Comput. vol. 15, No. 4, pp. 819-845, Jul. 1994. (Year: 1994).*

* cited by examiner

*Primary Examiner* — Emerson C Puente
*Assistant Examiner* — Yi Hao
(74) *Attorney, Agent, or Firm* — WOMBLE BOND DICKINSON (US) LLP

(57) ABSTRACT

Computational fluid dynamics simulations of objects with many similar but distinct flow boundary regions on a larger surface can use an approach that creates geometries and meshes for the larger surface (e.g., a first mesh) independently of geometries and meshes for the distinct flow boundary regions (second mesh). The second mesh can be imprinted onto the first mesh prior to a CFD simulation, and if a revision to the design of the regions is desired, a revised mesh for the regions (based on a revised geometry for the regions) can be imprinted on the first mesh without having to redo the first mesh. Thus, revisions of the design can avoid recreating the first mesh.

20 Claims, 13 Drawing Sheets

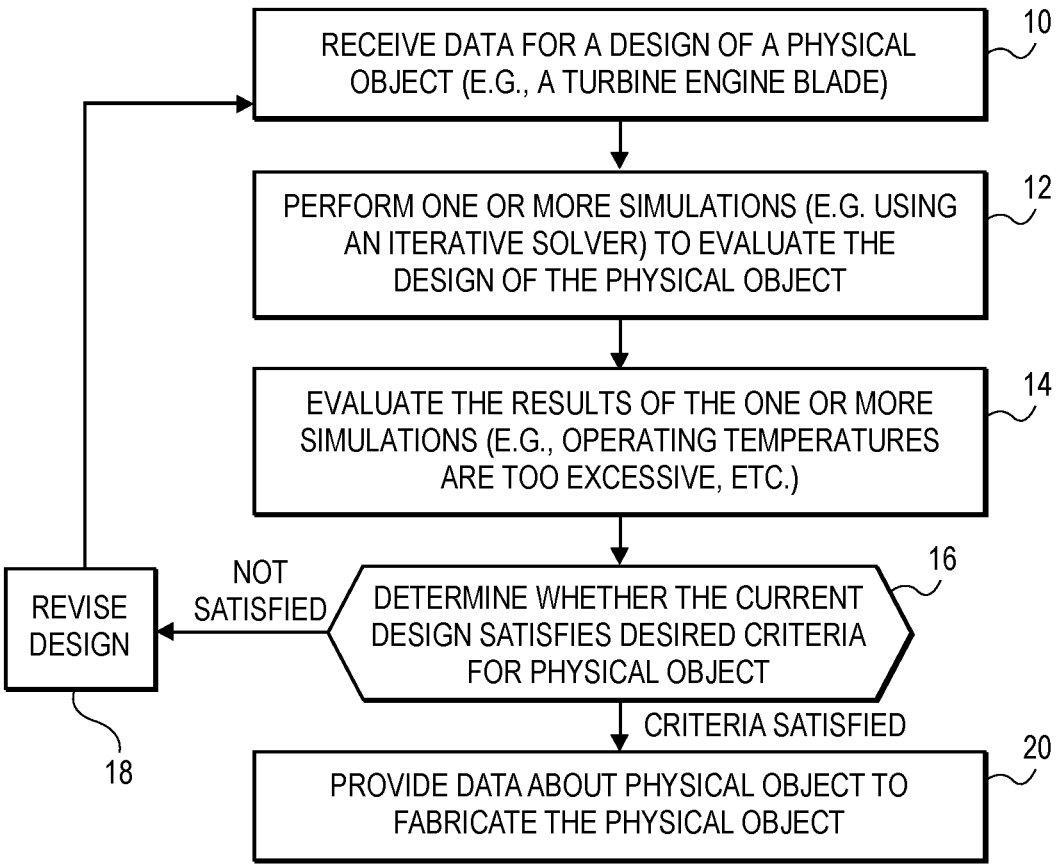

RECEIVE DATA FOR A DESIGN OF A PHYSICAL OBJECT (E.G., A TURBINE ENGINE BLADE)    10

PERFORM ONE OR MORE SIMULATIONS (E.G. USING AN ITERATIVE SOLVER) TO EVALUATE THE DESIGN OF THE PHYSICAL OBJECT    12

EVALUATE THE RESULTS OF THE ONE OR MORE SIMULATIONS (E.G., OPERATING TEMPERATURES ARE TOO EXCESSIVE, ETC.)    14

REVISE DESIGN    NOT SATISFIED    DETERMINE WHETHER THE CURRENT DESIGN SATISFIES DESIRED CRITERIA FOR PHYSICAL OBJECT    16

18

CRITERIA SATISFIED

PROVIDE DATA ABOUT PHYSICAL OBJECT TO FABRICATE THE PHYSICAL OBJECT    20

FIG. 1

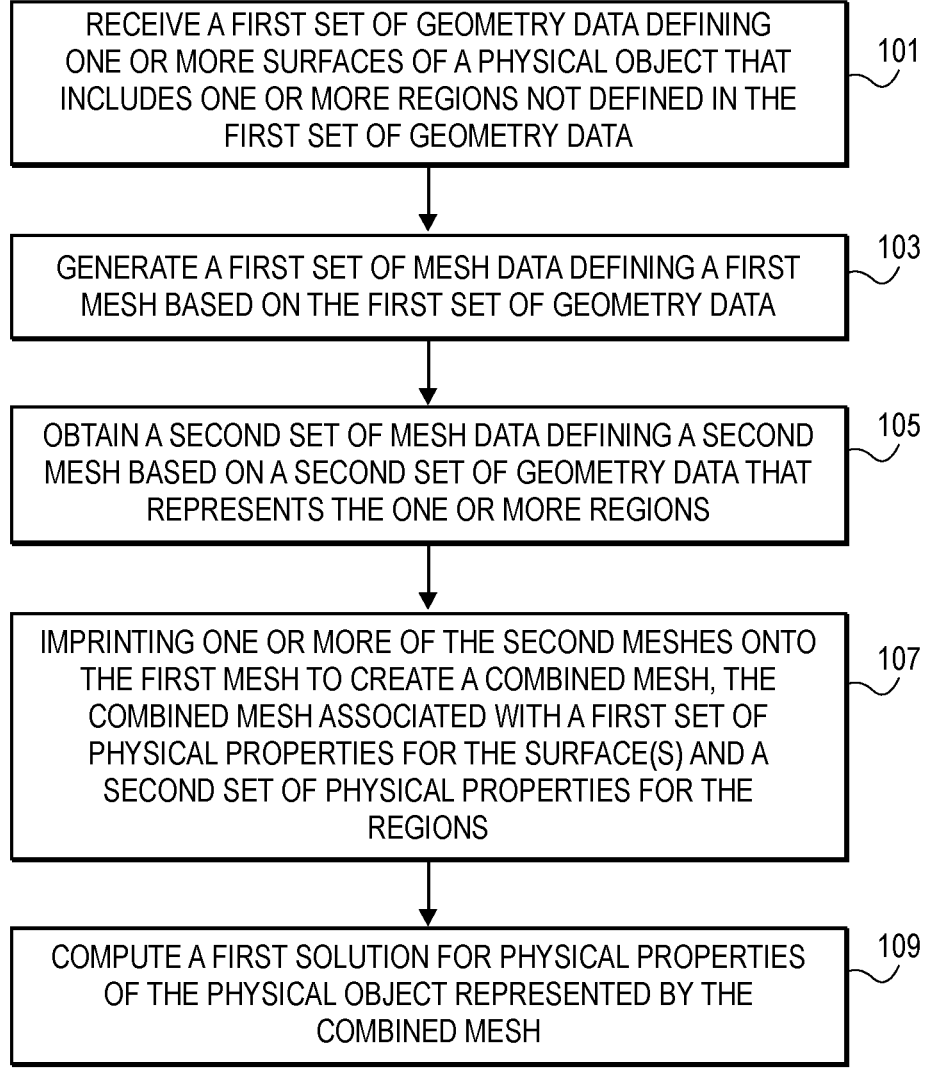

RECEIVE A FIRST SET OF GEOMETRY DATA DEFINING ONE OR MORE SURFACES OF A PHYSICAL OBJECT THAT INCLUDES ONE OR MORE REGIONS NOT DEFINED IN THE FIRST SET OF GEOMETRY DATA — 101

GENERATE A FIRST SET OF MESH DATA DEFINING A FIRST MESH BASED ON THE FIRST SET OF GEOMETRY DATA — 103

OBTAIN A SECOND SET OF MESH DATA DEFINING A SECOND MESH BASED ON A SECOND SET OF GEOMETRY DATA THAT REPRESENTS THE ONE OR MORE REGIONS — 105

IMPRINTING ONE OR MORE OF THE SECOND MESHES ONTO THE FIRST MESH TO CREATE A COMBINED MESH, THE COMBINED MESH ASSOCIATED WITH A FIRST SET OF PHYSICAL PROPERTIES FOR THE SURFACE(S) AND A SECOND SET OF PHYSICAL PROPERTIES FOR THE REGIONS — 107

COMPUTE A FIRST SOLUTION FOR PHYSICAL PROPERTIES OF THE PHYSICAL OBJECT REPRESENTED BY THE COMBINED MESH — 109

FIG. 3A

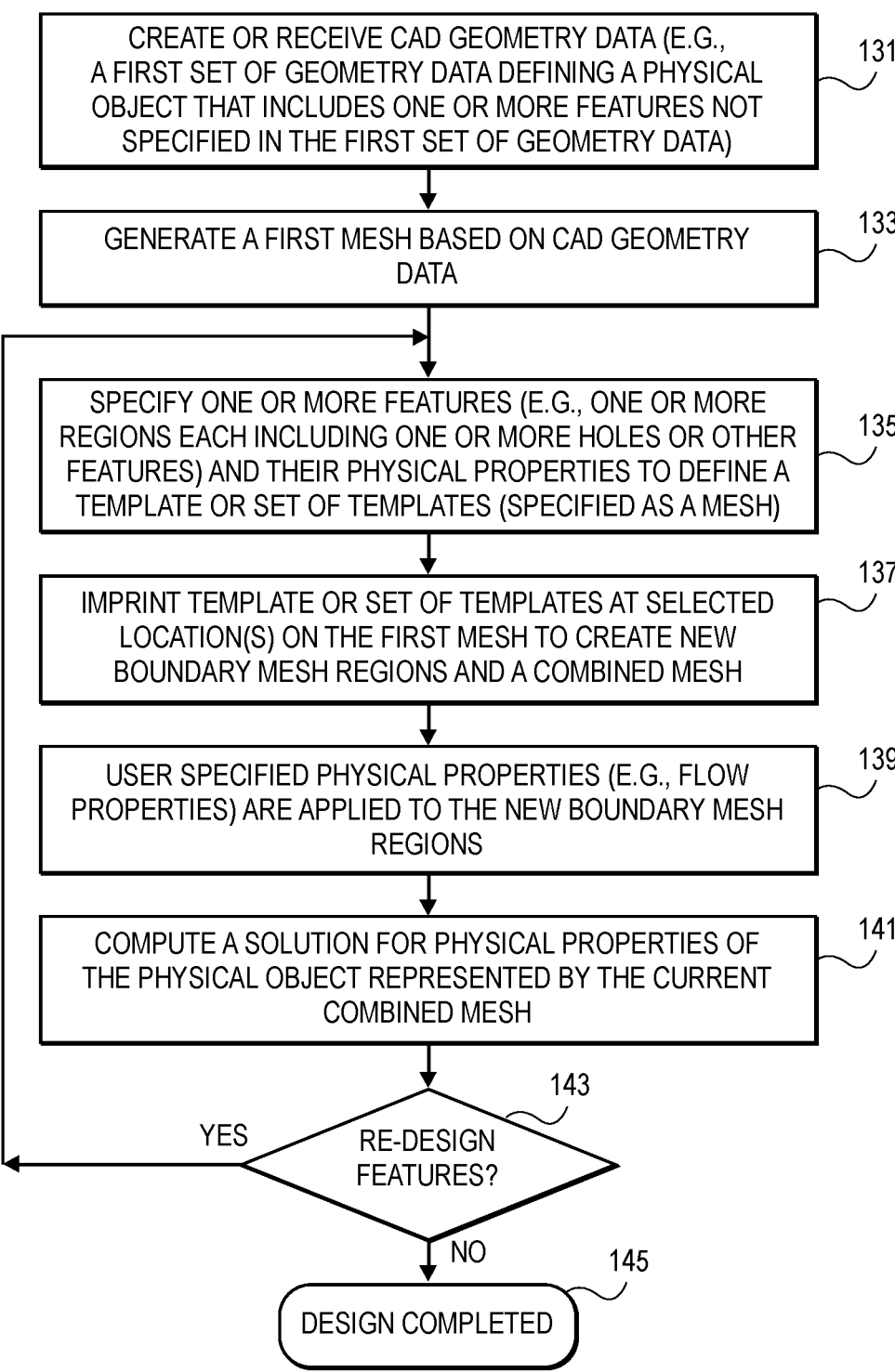

CREATE OR RECEIVE CAD GEOMETRY DATA (E.G., A FIRST SET OF GEOMETRY DATA DEFINING A PHYSICAL OBJECT THAT INCLUDES ONE OR MORE FEATURES NOT SPECIFIED IN THE FIRST SET OF GEOMETRY DATA) — 131

GENERATE A FIRST MESH BASED ON CAD GEOMETRY DATA — 133

SPECIFY ONE OR MORE FEATURES (E.G., ONE OR MORE REGIONS EACH INCLUDING ONE OR MORE HOLES OR OTHER FEATURES) AND THEIR PHYSICAL PROPERTIES TO DEFINE A TEMPLATE OR SET OF TEMPLATES (SPECIFIED AS A MESH) — 135

IMPRINT TEMPLATE OR SET OF TEMPLATES AT SELECTED LOCATION(S) ON THE FIRST MESH TO CREATE NEW BOUNDARY MESH REGIONS AND A COMBINED MESH — 137

USER SPECIFIED PHYSICAL PROPERTIES (E.G., FLOW PROPERTIES) ARE APPLIED TO THE NEW BOUNDARY MESH REGIONS — 139

COMPUTE A SOLUTION FOR PHYSICAL PROPERTIES OF THE PHYSICAL OBJECT REPRESENTED BY THE CURRENT COMBINED MESH — 141

143

RE-DESIGN FEATURES?

YES

NO

145

DESIGN COMPLETED

FIG. 3B

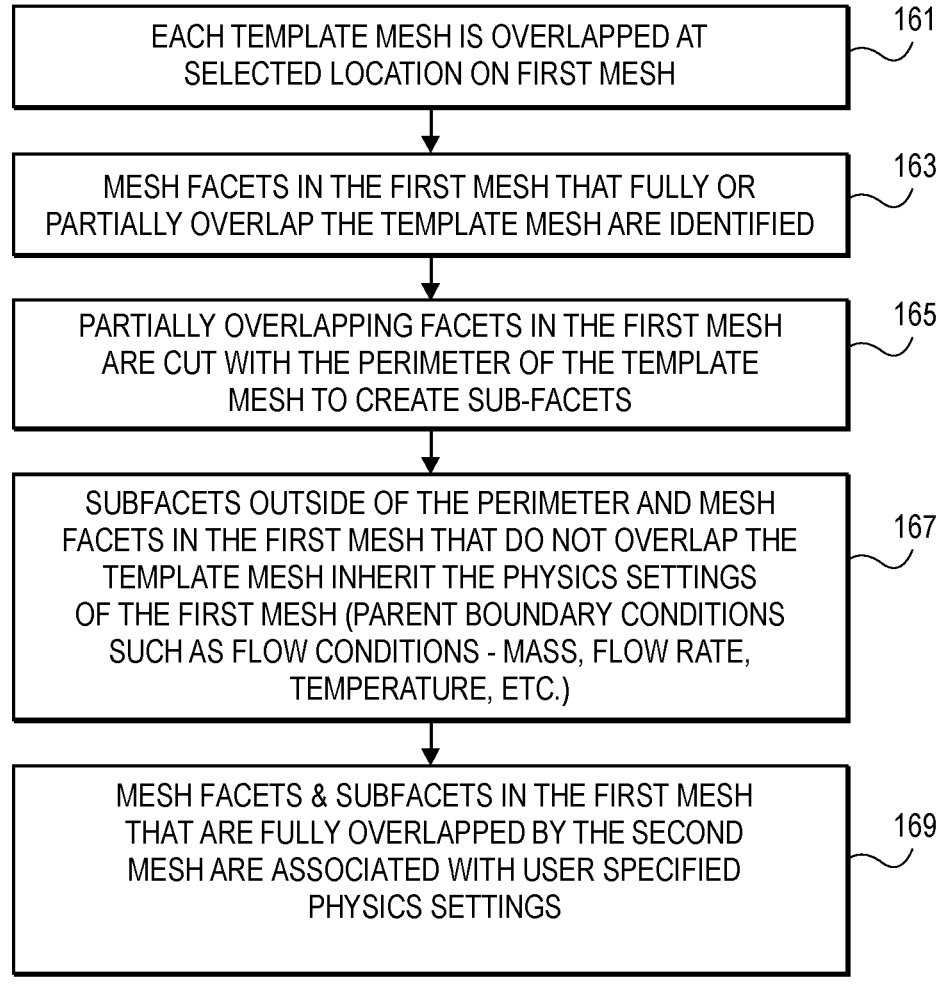

EACH TEMPLATE MESH IS OVERLAPPED AT SELECTED LOCATION ON FIRST MESH — 161

MESH FACETS IN THE FIRST MESH THAT FULLY OR PARTIALLY OVERLAP THE TEMPLATE MESH ARE IDENTIFIED — 163

PARTIALLY OVERLAPPING FACETS IN THE FIRST MESH ARE CUT WITH THE PERIMETER OF THE TEMPLATE MESH TO CREATE SUB-FACETS — 165

SUBFACETS OUTSIDE OF THE PERIMETER AND MESH FACETS IN THE FIRST MESH THAT DO NOT OVERLAP THE TEMPLATE MESH INHERIT THE PHYSICS SETTINGS OF THE FIRST MESH (PARENT BOUNDARY CONDITIONS SUCH AS FLOW CONDITIONS - MASS, FLOW RATE, TEMPERATURE, ETC.) — 167

MESH FACETS & SUBFACETS IN THE FIRST MESH THAT ARE FULLY OVERLAPPED BY THE SECOND MESH ARE ASSOCIATED WITH USER SPECIFIED PHYSICS SETTINGS — 169

IMPRINTING

FIG. 3C

NON-OVERLAP SURFACE
271

NEW OVERLAPPED BOUNDARY
WITH SURFACE MESH
273

IMPRINTING

ORIGINAL SURFACE
261

HOLE LOCATION
263

267

265

DEFINE TEMPLATE

301

CREATING VIRTUAL BOUNDARIES FOR MODELLING PATTERNED BOUNDARY CONDITIONS WITHIN SIMULATIONS

BACKGROUND

This disclosure relates to the field of systems for designing or testing physical objects such as components in gas turbine engines and many other physical objects.

The process of designing physical objects often requires that the designers of the objects test the objects. This testing can involve testing of an object (e.g., a product) after it is manufactured (which may be an expensive endeavor) or testing of the object before it is manufactured (thereby avoiding the expense associated with manufacturing the object). Computer simulations of a product provide one way to test objects before they are manufactured.

Many products need to be tested to make sure they will function properly in extreme temperatures. For example, gas turbines often can operate at temperatures that are near the melting points of components in the turbine, such as the turbine blades. Computational fluid dynamics (CFD) methodology can be used to evaluate the design of a product using a CFD simulation system, such as a computer system that executes CFD simulation software such as Ansys Fluent or Ansys CFX or Icepak from Ansys, Inc. of Canonsburg, Pennsylvania.

Computational fluid dynamics (CFD) simulations of objects with a pattern of many similar but distinct boundary regions on a larger surface often require repeatedly creating, in a computer aided design (CAD) system, the different geometries of the design, where the repetition in the design process involves changing the many similar regions while keeping the larger surface the same. The regions can be a pattern of holes in the larger surface, such as holes in a gas turbine engine blade. In each repetition, the entire geometries must be specified, including the geometries of the larger surface (which may remain the same as before) as well as the regions with the pattern of holes. This makes the design process more burdensome and also increases the chances for errors (which may not be immediately detected).

SUMMARY OF THE DESCRIPTION

The embodiments in this disclosure can use a first mesh to represent a surface of an object and a set of one or more second meshes to represent one or more regions on the surface. The first mesh may represent a larger surface that includes the one or more regions. For example, the first mesh may represent the surface of a gas turbine engine blade, and each of the regions is a hole, and the regions form a pattern in that surface. The set of one or more second meshes may represent holes or other features on the larger surface. A method can involve creating the geometry for the larger surface separately from creating geometries for the one or more regions. Thus, if the larger surface remains the same from one design iteration to the next design iteration (which changes the one or more regions without changing the larger surface), the design process can change the set of one or more second meshes without changing the first mesh (and its associated geometry data). The set of one or more second meshes can be imprinted onto the first mesh during each design iteration, and a simulation (e.g., a CFD simulation or other computational simulations) can be performed using the modified mesh that results from the imprinting.

A method according to one embodiment can include the following operations: receiving a first set of geometry data defining one or more surfaces for modeling a physical object to be simulated, the physical object including one or more regions not defined in the first set of geometry data; generating a first set of mesh data defining a first mesh based on the first set of geometry data, the first mesh corresponding to the one or more surfaces for the physical object, the first set of mesh data associated with a first set of one or more physical properties; obtaining a second set of mesh data defining a second mesh based on a second set of geometry data representing the one or more regions, the second mesh corresponding to the one or more regions of the physical object, the second set of mesh data associated with a second set of one or more physical properties; imprinting one or more of the second meshes onto the first mesh to model the one or more regions of the physical object, wherein the second mesh is imprinted to create a combined surface mesh associated with a combination of the first set of one or more physical properties and the second set of one or more physical properties; and computing a first solution for physical properties of the physical object represented by the combined mesh.

In one embodiment, wherein the first mesh and the second mesh are associated with data for use in one or more computational fluid dynamics (CFD) simulations and wherein each of the one or more regions includes one or more features such as holes in the physical object. In one embodiment, applied boundary condition properties in the first set of one or more physical properties and the second set of one or more physical properties are flow properties used in the CFD simulations.

In one embodiment, the method can include a series of design iterations in which the regions (e.g., pattern of holes on the larger surface) are modified while the larger surface remains unchanged. For example, the method can further include the operations of: obtaining a third set of geometric data defining a third mesh based on the third set of geometry data representing the one or more regions as modified by the third set of geometric data; and imprinting one or more of the third meshes onto the first mesh to create a second combined mesh. The method can further include the operation of: applying the second set of one or more physical properties for each of the imprinted third meshes. The method can also further include the operation: computing a second solution for physical properties of the physical object represented by the combined mesh based on the imprinted third meshes. In one embodiment, as a result of the imprinting, non-overlapping facets in the first mesh inherit physical properties from the first mesh.

The aspects and embodiments described herein can include non-transitory machine readable media that can store executable computer program instructions that when executed cause one or more data processing systems to perform the methods described herein when the computer program instructions are executed. The instructions can be stored in non-transitory machine readable media such as in dynamic random access memory (DRAM) which is volatile memory or in nonvolatile memory, such as flash memory or other forms of memory. The aspects and embodiments described herein can also be in the form of data processing systems that are built or programmed to perform these methods. For example, a data processing system can be built with hardware logic to perform these methods or can be programmed with a computer program to perform these methods and such a data processing system can be considered a simulation system.

The above summary does not include an exhaustive list of all embodiments and aspects in this disclosure. All systems, media, and methods can be practiced from all suitable combinations of the various aspects and embodiments summarized above and also those disclosed in the detailed description below.

BRIEF DESCRIPTION OF THE DRAWINGS

The present invention is illustrated by way of example and not limitation in the figures of the accompanying drawings in which like references indicate similar elements.

FIG. 1 is a flow chart that shows a method of using one or more embodiments described herein to design a physical object and to evaluate the design of the physical object using a simulation process.

FIG. 3A is a flow chart that shows a method according to one embodiment.

FIG. 3B is a flow chart that shows a method according to another embodiment.

FIG. 3C is a flow chart that shows a method for imprinting that can be used in the embodiments described herein.

DETAILED DESCRIPTION

Figure 2A:
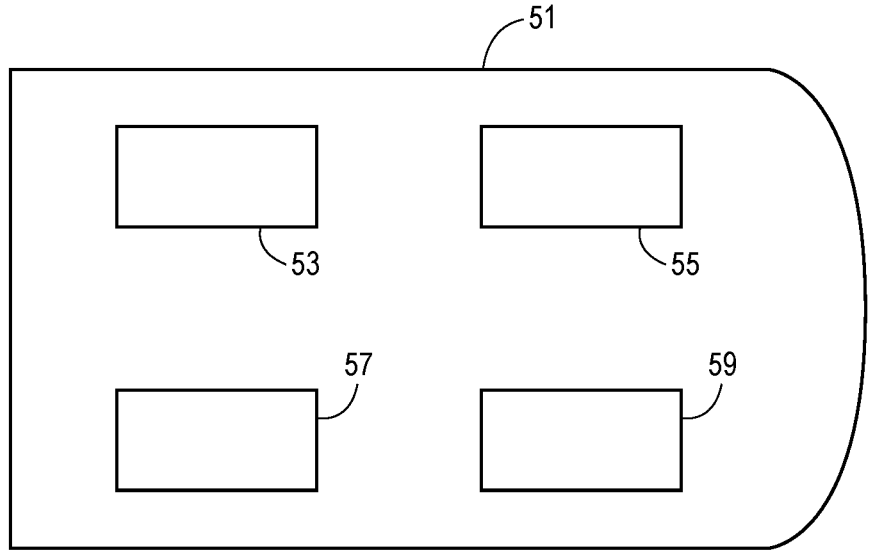
FIG. 2A shows the surface of a physical object that includes features, such as (for example) holes in the object, with the holes arranged in several patterns on the object.

Various embodiments and aspects will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments.

Reference in the specification to "one embodiment" or "an embodiment" means that a particular feature, structure, or characteristic described in conjunction with the embodiment can be included in at least one embodiment. The appearances of the phrase "in one embodiment" in various places in the specification do not necessarily all refer to the same embodiment. The processes depicted in the figures that follow are performed by processing logic that comprises hardware (e.g. circuitry, dedicated logic, etc.), software, or a combination of both. Although the processes are described below in terms of some sequential operations, it should be appreciated that some of the operations described may be performed in a different order. Moreover, some operations may be performed in parallel rather than sequentially.

The embodiments described herein can be used in the process of designing physical objects that contain a set of one or more features that may require multiple design iterations in order to achieve desired performance results for the physical object. A gas turbine engine is an example of such an object. Gas turbine engines are used in many things such as jet engines, locomotives, ships, electrical generators, gas compressors, etc. The blades in gas turbine engines can be exposed to very high temperatures during normal operation of the gas turbine engines, and this can result in the failure of the blades, which can produce catastrophic results. A current desire is to increase the operating temperature of the gas turbine to improve energy efficiency in the gas turbine engine, and thus there is a desire to find ways to cool the blades by introducing holes over the surface of the blades. The pattern of holes and the number and size of holes can be varied over a huge number of possibilities. Thus, multiple design iterations are required to test the different patterns of holes in order to find at least an adequate solution for a blade based on design requirements or goals.

FIG. 1 shows a method in which these design requirements can be tested relative to a particular design of an object which is being simulated for a given system. In operation 10 of FIG. 1, a data processing system (e.g., a computer executing simulation software to provide a simulation system) can receive data about a design for a particular object (e.g., a gas turbine engine blade, or a shower head, or a filter, etc.). The data can be created in CAD (computer aided design) software on a data processing system, and the data can include information about the geometry of the object, information about the materials in the object, etc. Then in operation 12, the data processing system can perform one or more simulations (such as computational fluid dynamics (CFD) simulations based on physical models of the object) to evaluate the design of the object by determining, for example, static and transient thermal data (such as changes in temperature values over time at various locations on the object) during the simulated operation of the object. These simulations can use the aspects and embodiments described herein. In operation 14, the designer can evaluate the results of one or more simulations to determine whether the design of the object satisfies certain desired performance criteria for the design (e.g., the gas turbine blade will become too hot during normal operation, resulting in accelerated failure). This determination is shown in operation 16. If the one or more criteria is satisfied, then the designer in operation 20 can provide data about the object to allow the fabrication or manufacture of the object. For example, if the one or more criteria are satisfied, a CAD file can be produced that describes how to build the object. If the criteria are not satisfied as determined in operation 16, the designer can revise the design in operation 18 (for example, by changing sizes and/or quantity of the holes or other cooling mechanisms and/or changing the design of blades, etc.) and repeat the process by performing additional further simulations to evaluate the redesigned circuit and system. This can be repeated until the desired criteria are achieved for the object.

While a gas turbine engine blade is often used as an example in this disclosure, it will be appreciated that the embodiments described herein can be used for other types of objects that have regions that may need multiple design iterations during the design and development process.

Figure 2B:
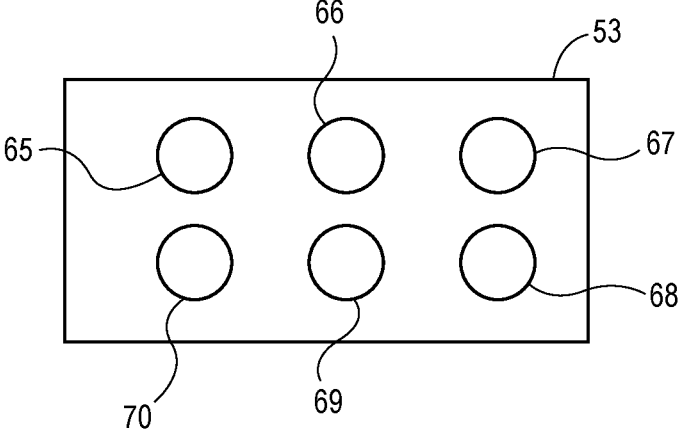
FIG. 2B shows an example of one of the patterns on the object shown in FIG. 2A.

FIG. 2A shows an example of the surface of a physical object 51, which may be a gas turbine blade. The object 51 has a shape and size that is described by its geometric data (usually specified in the process of entering data into CAD software), and the object 51 also has patterns of features spread over the surface of the object 51 according to the particular design that is being examined by simulations. The patterns 53, 55, 57 and 59 may include a pattern of holes which are the features in this example, with each hole being a feature. Each pattern may have the same number of holes arranged in the same way, with the same size holes; alternatively, the number of holes in each pattern may be different and the arrangement of the holes may be different across the patterns, and the sizes of the holes may vary, etc. FIG. 2B shows an example of a particular pattern 53 in which there are six (6) holes 65, 66, 67, 68, 69, and 70 that have the same size and shape (circular holes). These holes may represent inlet flow (inflow) holes or outlet flow (outflow) holes in one example. These holes are arranged in a rectangular grid like fashion in this example. While holes are used as the primary example of a feature that may require many design iterations, other types of features may also be used in other embodiments, and these other features may not necessarily be flow regions and could be bumps or depressions on the surface of the object. In this description, features are also referred to as regions (e.g., a hole can be considered a region).

Figure 4A:
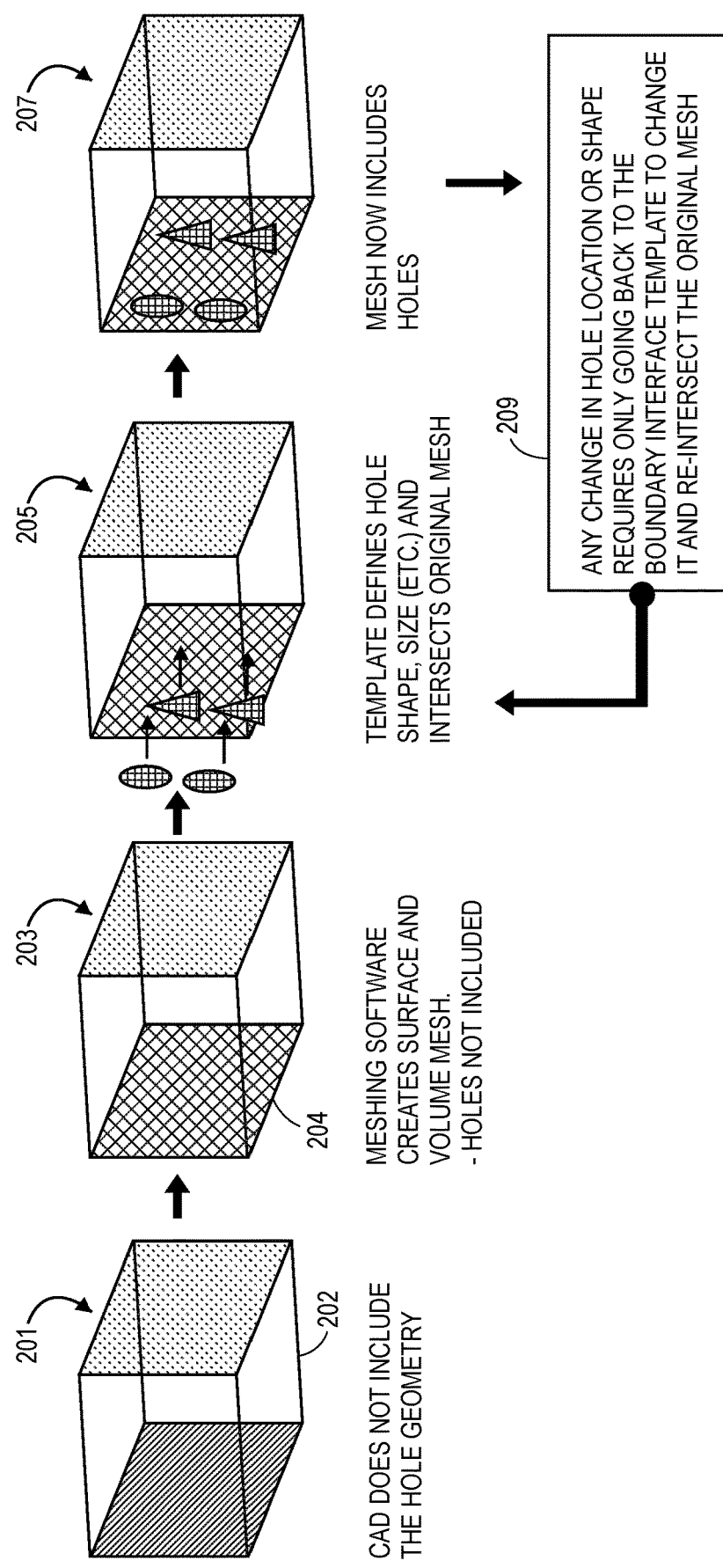
FIG. 4A shows an example of a method according to one embodiment in which two templates are imprinted onto an original mesh.

FIG. 3A shows a method according to one embodiment for designing a physical object. In operation 101 of FIG. 3A, a simulation system can receive a first set of geometry data that defines one or more surfaces of a physical object that includes one or more regions which are not defined in the first set of geometry data. The first set of geometry data defines the size and shape of the object without specifying the locations, sizes and shapes of each of the one or more regions (such as one or more holes). The first set of geometry data can be generated in CAD software and received by the simulation system or may be generated in the simulation system itself (e.g., through user entry of the geometry data). Operation 201 in FIG. 4A shows an example of an object 202 for which a first set of CAD geometry data defines the size and shape of the object 202 but does not include or define the hole(s) geometries for the holes in the object 202. In operation 103 in FIG. 3A, the simulation system can generate a first set of mesh data that defines a first mesh based on the first set of geometry data; in one embodiment, conventional meshing software can generate this first mesh. Operation 203 in FIG. 4A shows an example of the result of the generation of the first mesh (shown as mesh 204) for the object 202.

In operation 105 in FIG. 3A, the simulation system can obtain a second set of mesh data that defines one or more second meshes, each of which is for a region or feature such as a hole in the object defined by the first set of geometry data. The simulation system may receive a second set of geometry data for each feature (e.g., geometry data specifying the location of the feature, the size of the feature and the shape of the feature) and then generate a second mesh for each feature. Each second mesh may be referred to as a template. The second set of mesh data may, as shown in FIG. 4A, specify many holes with the same or different sizes and the same or different shapes. In operation 205 shown in FIG.

4A, one template is used to define two elliptical shaped holes in object 202 and another template is used to define two triangular shaped holes in object 202. Once the one or more second meshes are generated, they are imprinted at selected, specified locations on the first mesh in operation 107 in FIG. 3A. Operation 207 in FIG. 4A shows an example of the result of this imprinting process. This imprinting process causes an intersection or overlap of the first mesh and the one or more second meshes. This imprinting process, explained further below, creates a combined mesh (resulting from this intersection) that is associated with a first set of physical properties (e.g., CFD flow properties such as mass, flow rates, temperatures, etc. used in conventional CFD simulations) for the first mesh that does not overlap the one or more second meshes, and is associated with a second set of physical properties for the areas that do overlap the one or more second meshes. Both the first set of physical properties and the second set of physical properties will be used in the simulations (e.g., CFD simulations) in operation 109 in FIG. 3A. Operation 109 can use conventional physics simulations or multi-physics simulations to compute the first solution based on the combined mesh and its associated first and second set of physical properties. In the case of a gas turbine engine blade, operation 109 can use conventional CFD simulations (e.g., using Ansys Fluent) for the flow of hot gases around and through the blade during normal operation of the gas turbine engine to determine the operating temperatures at various locations across the blade, using the first set of physical properties in those portions of the blade that do not have holes and using the second set of physical properties for the holes in the blade. Object 202 may be a portion of such a blade or another object for another type of physics simulation.

Figure 4B:
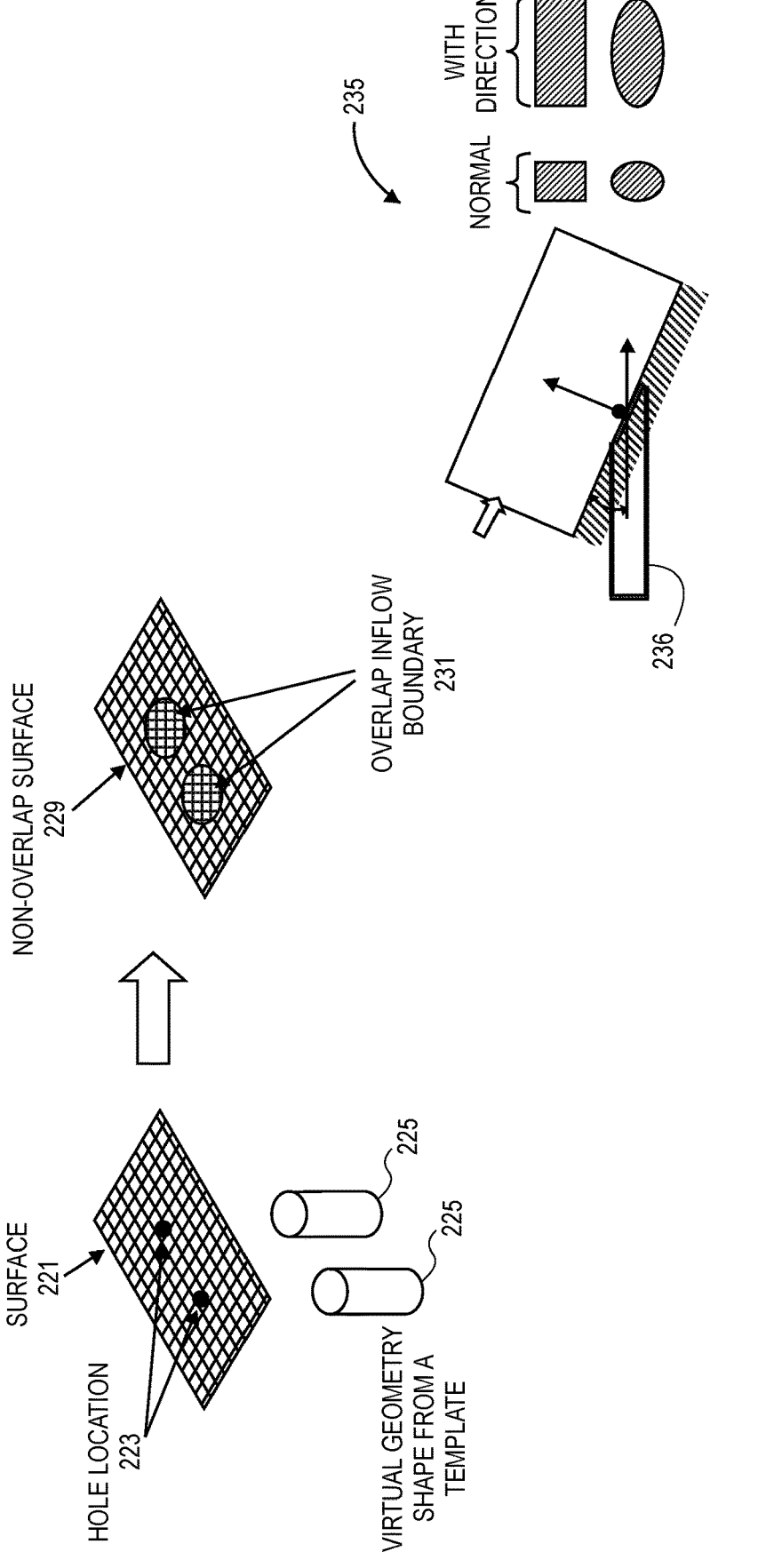
FIG. 4B shows an example of a method according to one embodiment in which a template is used to imprint two holes with a directional consideration on an original surface.
Figure 4C:
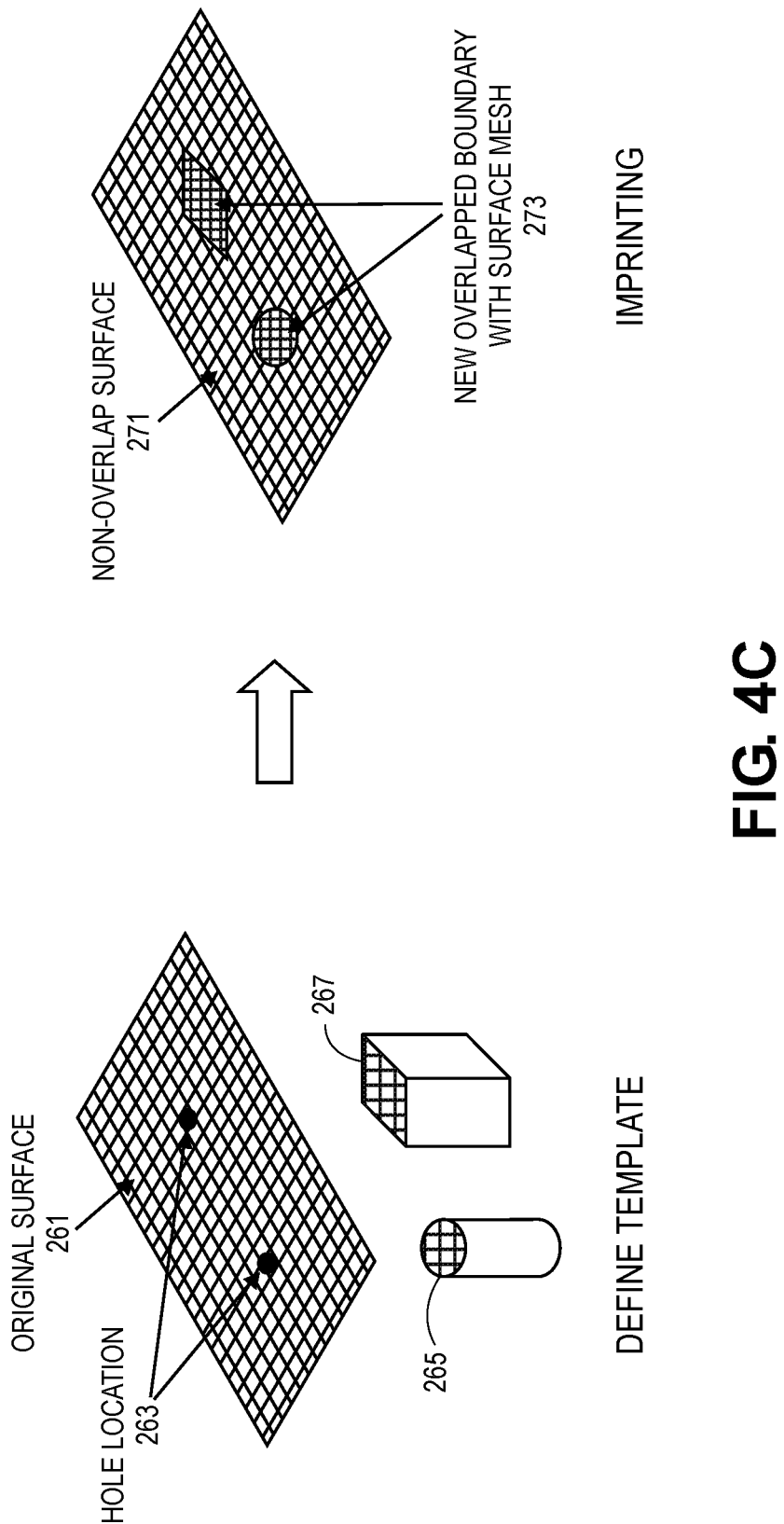
FIG. 4C shows an example of a method according to one embodiment in which two different templates are used to imprint two different holes on an original surface.

FIGS. 4B and 4C show two pictorial representations of the methods described herein. These pictorial representations, along with the pictorial representation in FIG. 4A, depict the method shown in FIG. 3A or the method shown in FIG. 3B. In FIG. 4B, a first mesh for a surface 221 is created and two hole locations 223 are specified relative to the first mesh; the surface 221 represents the boundary surface of a physical object (e.g., object 202) being simulated using the methods described herein. The surface 221 is defined by a first set of geometry data while the two holes are specified by second geometry data 225 (the same for both holes in this example). A second mesh or template is generated based on the second geometry data 225, and the two instances of the second mesh are intersected, at the hole locations 223, with the first mesh to produce a combined mesh that includes the non-overlap surface 229 and the overlap inflow boundary 231. The non-overlap surface 229 is the portion of the surface that does not intersect the two instances of the second mesh. The overlap inflow boundary 231 is the portion of the surface that does intersect the two instances of the second mesh so that the second mesh is imprinted into the first mesh at these intersections. Most of the examples in this disclosure assume a perpendicular intersection (an angle of 90 degrees or normal to the surface), but it is also possible to have intersections at angles other than 90 degrees. FIG. 4B shows a non-perpendicular intersection of the template 236 with the first mesh on the surface of the object 235.

In FIG. 4C, a first mesh for a surface 261 is created and two hole locations 263 are specified relative to the first mesh; the surface 261 represents a physical object (e.g., object 202) being simulated using the methods described herein. The surface 261 is defined by a first set of geometry data while the two holes are specified by a second set of geometry data that is used to create two different templates 265 and 267 (which are two different second meshes). The two different instances of the second mesh are intersected, at the hole locations 263, with the first mesh to produce a combined mesh that includes the non-overlap surface 271 and the two different overlap inflow boundaries 273. The non-overlap surface 271 is the portion of the surface that does not intersect the two different instances of the second mesh. The overlap inflow boundary 273 is the portion of the surface that does intersect the two different instances of the second mesh so that the second mesh is imprinted into the first mesh at these intersections.

Another example of a method will be provided while referring to FIG. 3B. This example emphasizes the ability of the embodiments described herein to make design changes without having to re-create the first mesh. In operation 131, a simulation system creates or receives CAD geometry data, such as a first set of geometry data that defines the shape and size of a physical object to be simulated, but the first set of geometry data does not describe any of the one or more features, such as holes, on the physical object. A simulation system, in operation 133, then generates a first mesh based on the CAD geometry data (from operation 131) and saves this first mesh for subsequent re-uses in the method shown in FIG. 3B. In operation 135, a designer specifies geometry data and physical property data for each of the one or more features such as holes on the physical object. This specified geometry data is used to generate a set of one or more second meshes, each of which is a template for one of the features. The physical property data for each feature can define, for example, the flow boundary conditions and other physical data used in a CFD simulation at each feature. The simulation system, in operation 137, then imprints each of the second meshes at the appropriate (user specified) location onto the first mesh to create a combined mesh. The new boundary mesh regions are created where each template overlaps the first mesh. Further description of the imprinting process is provided below in conjunction with FIGS. 3C and 5A-5D. In operation 139, the user specified physical properties (e.g., flow properties) are applied to each of the new regions of the combined mesh imprinted by the second meshes (so the simulation system has the appropriate physical data at each imprinted feature such as each imprinted hole). The simulation system then can, in operation 141, compute a solution for physical properties of the object represented by the combined mesh; for example, the simulation system can compute the temperatures at various location across the physical object after a CFD simulation of the object. At this point, a designer can review the results shown by the solution and decide, in operation 143, whether to change the design. If the results indicate the object appears to satisfy the design goals, the design process may be complete (145). On the other hand, if for example, the temperature data indicates that portion of the object become too hot during normal use, the designer can decide to revise the design by changing hole locations or hole shapes or hole sizes or changing the number of holes, etc. If a decision is taken to revise the design, the method loops back to operation 135, and the designer specifies changes to one or more of the features in the second meshes and the method continues from operation 135. This loop back re-uses the saved first mesh so the designer does not need to specify the first geometry data again and does not have to re-create the first mesh. Operation 209 in FIG. 4A also shows this loop back to the template definition operation if the design needs to be changed.

Figure 5A:
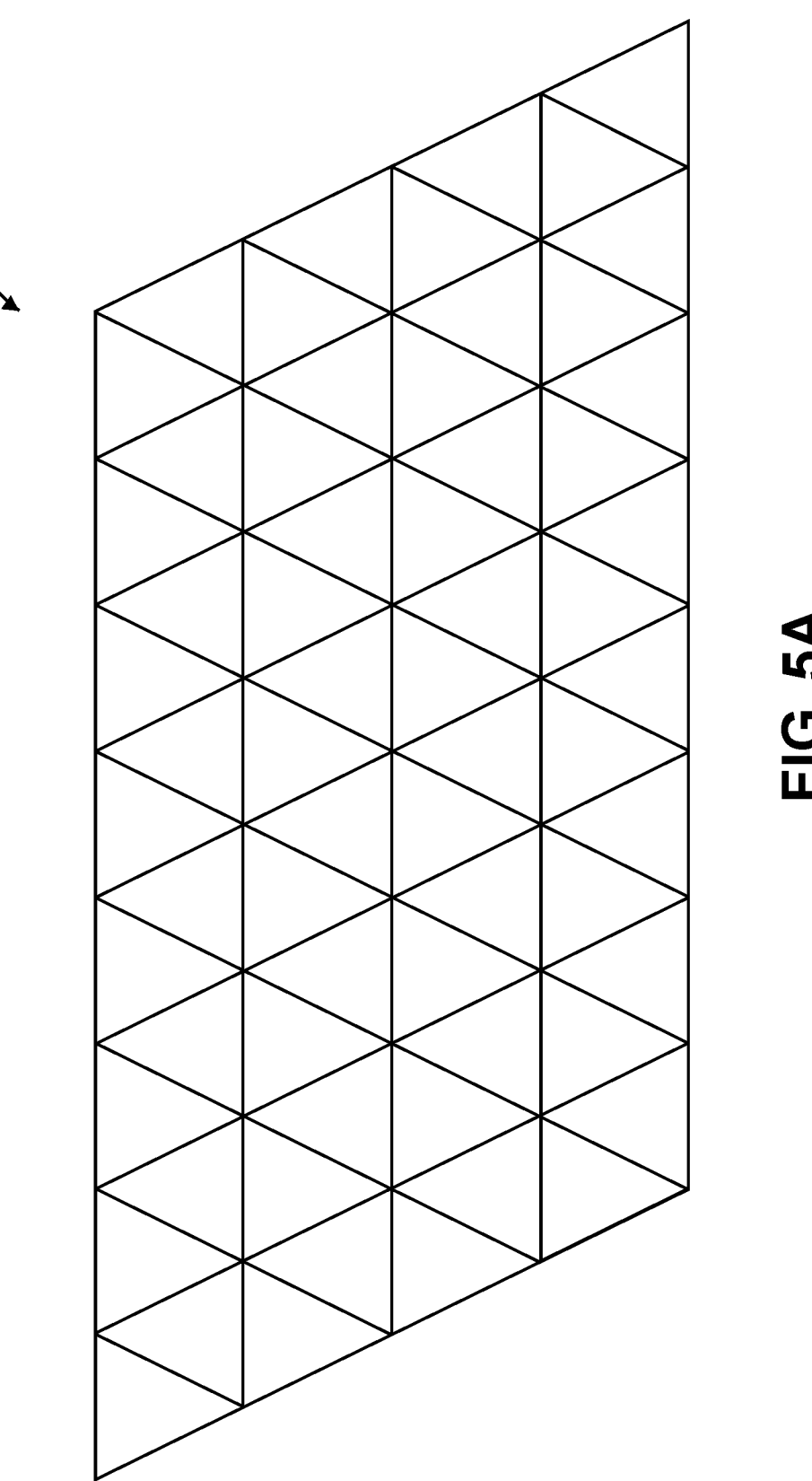
FIG. 5A shows an example of a first mesh on a surface of an object (such as the surface of a gas turbine engine blade); the mesh does not include any features such as holes in the surface.
Figure 5B:
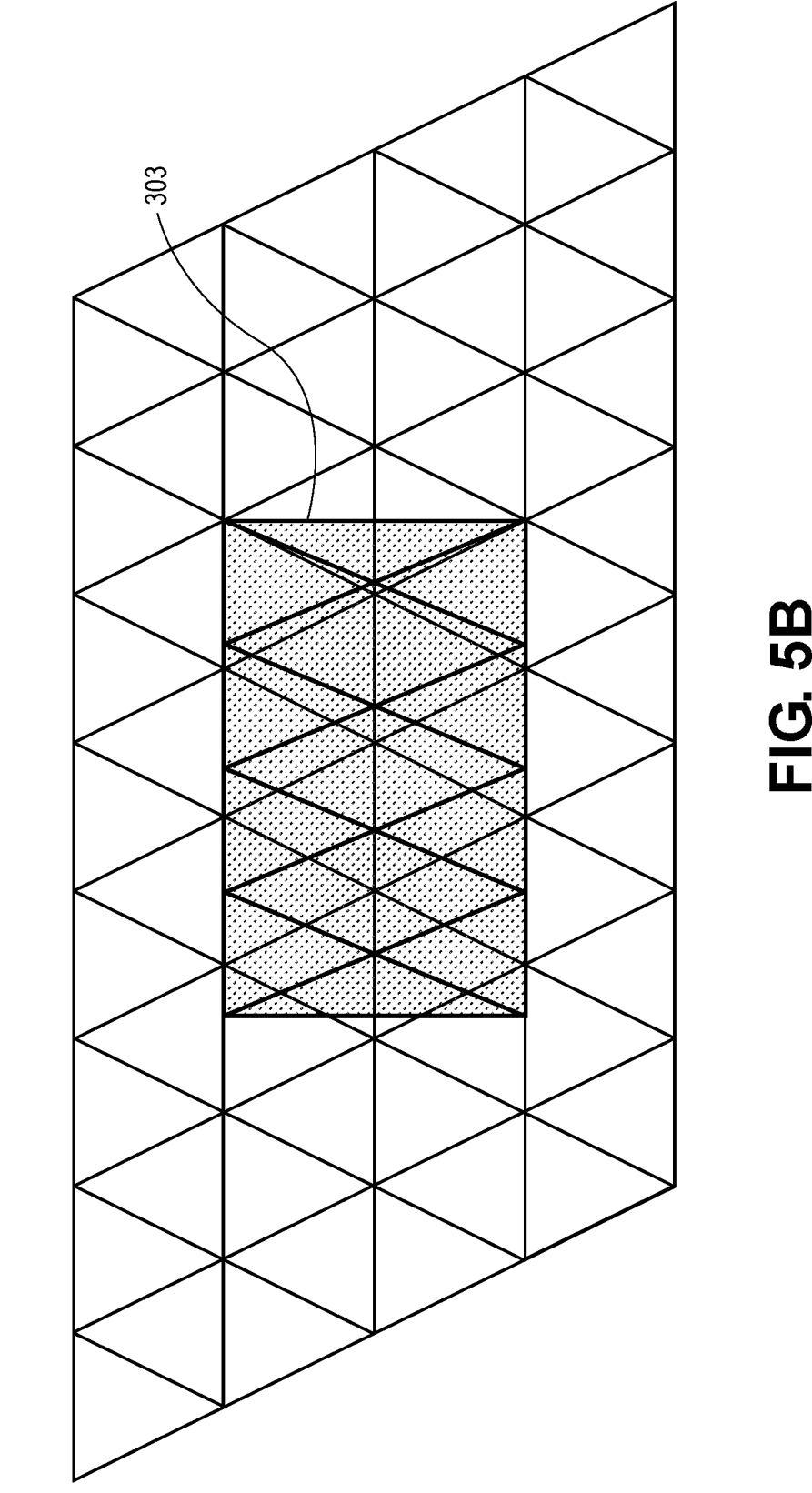
FIG. 5B shows the first mesh from FIG. 5A after a second mesh, representing a feature such as a hole, has been imprinted onto the first mesh.
Figure 5C:
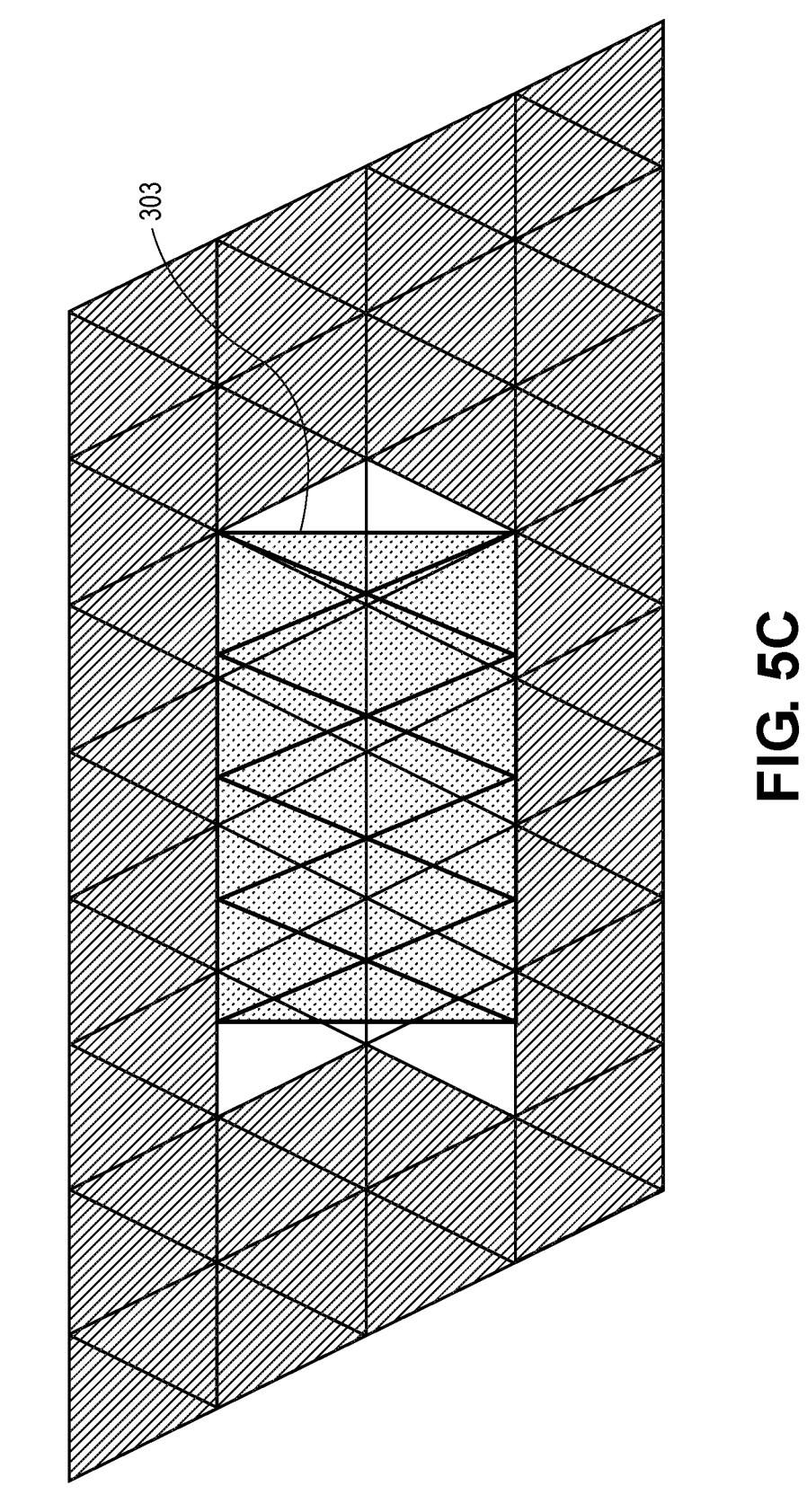
FIG. 5C shows a process for determining the intersection between the perimeters of the faces of the second mesh and the first mesh during the process of creating sub-facets in the first mesh during the imprinting.
Figure 5D:
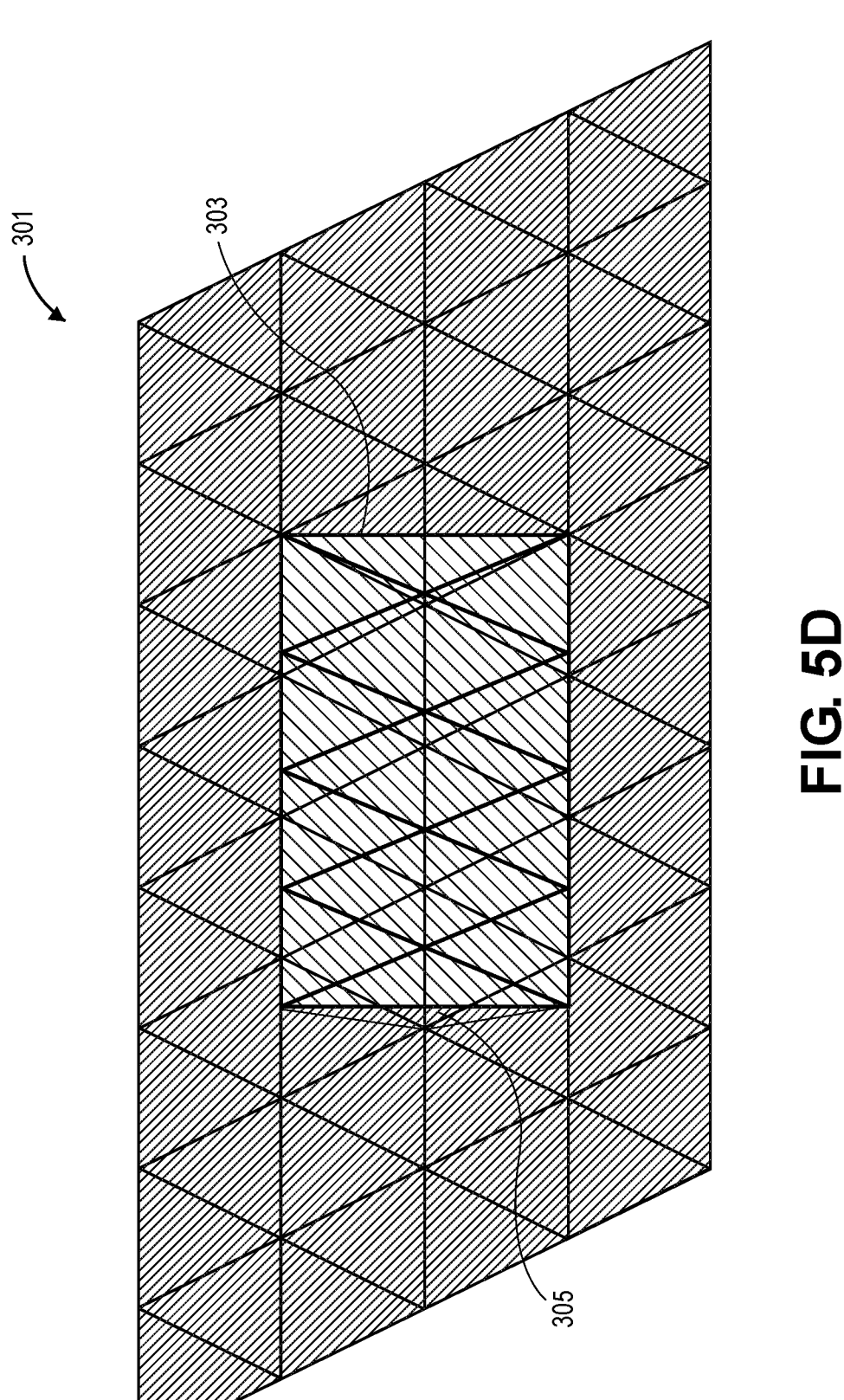
FIG. 5D shows the completion of the imprinting process that creates a combined mesh that results from the imprinting.

The process of imprinting each of the second meshes can use techniques known in the art to intersect and combine two meshes at specific locations. FIG. 3C provides an example of an imprinting process with emphasis on the aspects of the embodiments described herein. In operation 161, each template mesh (one of the second meshes) is overlapped at a selected location on the first mesh. FIG. 5A shows a first mesh 301, which may be, for example, mesh 204 on the surface of object 202 in FIG. 4A, and this first mesh 301 is shown, in FIG. 5B, overlapped with a second mesh 303. It can be seen from FIG. 5B, that this overlap causes some of the facets in the first mesh to be partially overlapped by the second mesh, while most of the facets (triangles in this example) in the first mesh are non-overlapping with the second mesh. These partially overlapped facets occur near the left and right sides of the perimeter of the second mesh 303 as shown in FIG. 5B. There are also some facets in the first mesh 301 that are fully overlapped by the second mesh 303 (such as the facets near the middle of the first mesh 301). These fully overlapping facets of the 1st mesh may still be cut by the edges of facets in the 2nd mesh, and both overlapping facets and overlapping sub-facets are moved directly into the new combined mesh, and represent parts of the holes. In operation 163, the simulation system identifies mesh facets in the first mesh that are fully or partially overlapped by the second mesh 303. FIG. 5C shows a result of operation 163 in which the edges of the second mesh 303 are used to identify such fully or partially overlapped mesh facets of the first mesh 301. In operation 165, the simulation system cuts, with the edges of each facet in the second mesh, such partially overlapped mesh facets to create sub-facets inside and outside of the perimeter. FIG. 5D shows the result of the creation of such sub-facets, such as sub-facet 305. Then, in operation 167, the simulation system assigns physical properties to the non-overlapping facets in the first mesh and the created sub-facets (outside of the perimeter) by inheriting those properties from the first mesh. This sets the physics settings for the facets and sub-facets outside of the perimeter of the second mesh. In operation 169, the mesh facets and sub-facets that are fully overlapped in the first mesh by the second mesh are associated with the user specified physics settings (such as the user specified physical properties applied in operation 139 in FIG. 3B). The result of the imprinting process is a combined mesh that can be used in operation 109 in FIG. 3A or operation 141 in FIG. 3B.

Figure 6:
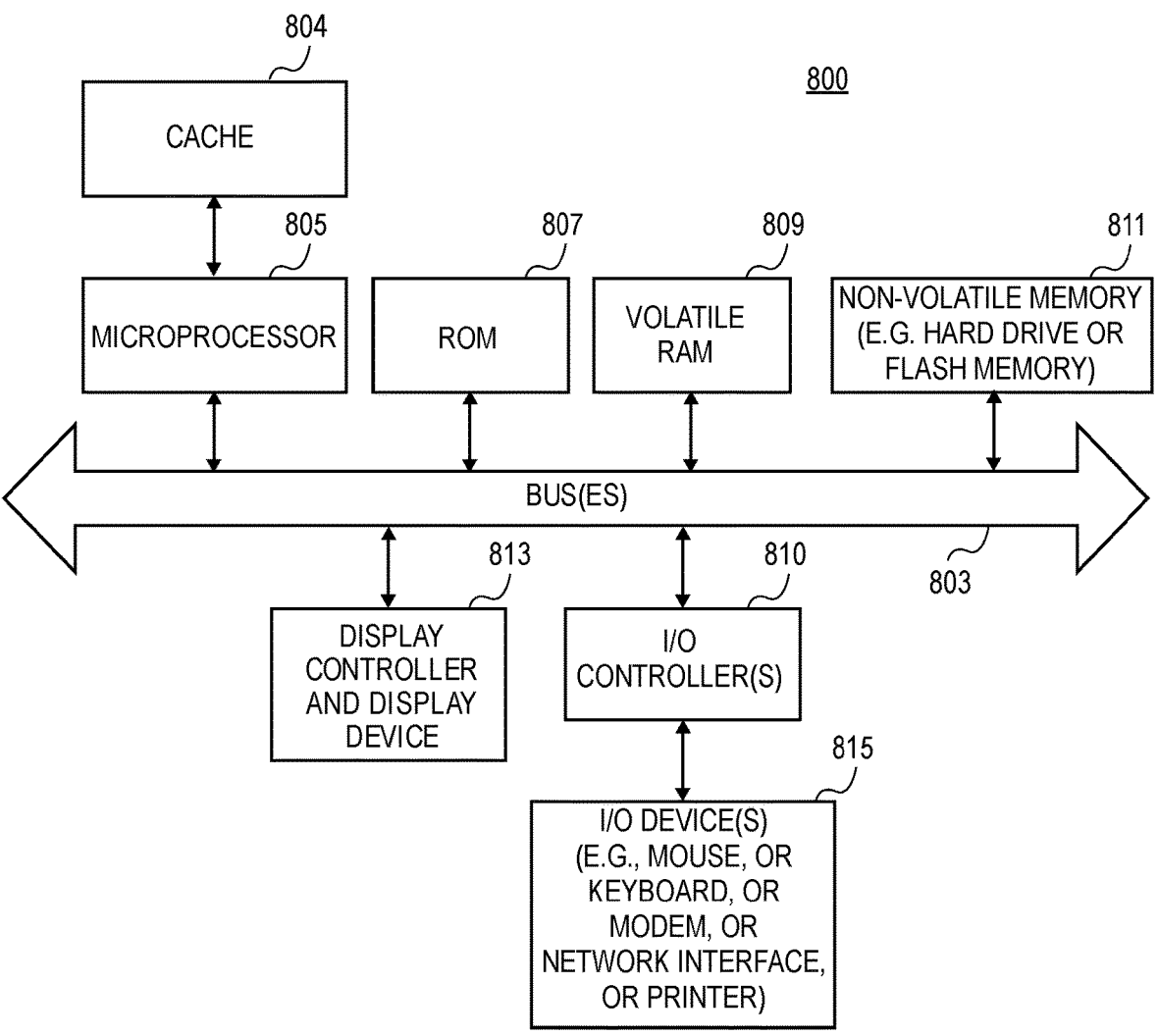
FIG. 6 shows an example of a data processing system that can be used to implement one or more embodiments described herein.

FIG. 6 shows one example of a data processing system 800, which may be used with one embodiment. For example, the system 800 may be implemented to provide a system or device that performs any one of the methods described herein. Thus, the system 800 is an example of a simulation system, and the system 800 can execute the simulation software described herein. Note that while FIG. 6 illustrates various components of a device, it is not intended to represent any particular architecture or manner of interconnecting the components as such details are not germane to the disclosure. It will also be appreciated that network computers and other data processing systems or other consumer electronic devices, which have fewer components or perhaps more components, may also be used with embodiments of the disclosure.

As shown in FIG. 6, the device 800, which is a form of a data processing system, includes a bus 803 which is coupled to a microprocessor(s) 805 and a ROM (Read Only Memory) 807 and volatile RAM 809 and a non-volatile memory 811. The microprocessor(s) 805 may retrieve the instructions from the memories 807, 809, 811 and execute the instructions to perform operations described above. The microprocessor(s) 805 may contain one or more processing cores. The bus 803 interconnects these various components together and also interconnects these components 805, 807, 809, and 811 to a display controller and display device 813 and to peripheral devices such as input/output (I/O) devices 815 which may be touchscreens, mice, keyboards, modems, network interfaces, printers and other devices which are well known in the art. Typically, the input/output devices 815 are coupled to the system through input/output controllers 810. The volatile RAM (Random Access Memory) 809 is typically implemented as dynamic RAM (DRAM), which requires power continually in order to refresh or maintain the data in the memory.

The non-volatile memory 811 is typically a magnetic hard drive or a magnetic optical drive or an optical drive or a DVD RAM or a flash memory or other types of memory systems, which maintain data (e.g., large amounts of data) even after power is removed from the system. Typically, the non-volatile memory 811 will also be a random access memory although this is not required. While FIG. 6 shows that the non-volatile memory 811 is a local device coupled directly to the rest of the components in the data processing system, it will be appreciated that embodiments of the disclosure may utilize a non-volatile memory which is remote from the system, such as a network storage device which is coupled to the data processing system through a network interface such as a modem, an Ethernet interface or a wireless network. The bus 803 may include one or more buses connected to each other through various bridges, controllers and/or adapters as is well known in the art.

Portions of what was described above may be implemented with logic circuitry such as a dedicated logic circuit or with a microcontroller or other form of processing core that executes program code instructions. Thus processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "virtual machine" (e.g., a Java Virtual Machine), an interpreter, a Common Language Runtime, a high-level language virtual machine, etc.), and/or electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

The disclosure also relates to an apparatus for performing the operations described herein. This apparatus may be specially constructed for the required purpose, or it may comprise a general-purpose device selectively activated or reconfigured by a computer program stored in the device. Such a computer program may be stored in a non-transitory computer readable storage medium, such as, but not limited to, any type of disk including floppy disks, optical disks, CD-ROMs, and magnetic-optical disks, DRAM (volatile), flash memory, read-only memories (ROMs), RAMs, EPROMS, EEPROMs, magnetic or optical cards, or any type of media suitable for storing electronic instructions, and each coupled to a device bus.

A machine readable medium includes any mechanism for storing information in a form readable by a machine (e.g., a computer). For example, a non-transitory machine readable medium includes read only memory ("ROM"); random access memory ("RAM"); magnetic disk storage media; optical storage media; flash memory devices; etc.

An article of manufacture may be used to store program code. An article of manufacture that stores program code may be embodied as, but is not limited to, one or more non-transitory memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)) and then stored in non-transitory memory (e.g., DRAM or flash memory or both) in the client computer.

The preceding detailed descriptions are presented in terms of algorithms and symbolic representations of operations on data bits within a device memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "determining," "sending," "terminating," "waiting," "changing," or the like, refer to the action and processes of a device, or similar electronic computing device, that manipulates and transforms data represented as physical (electronic) quantities within the device's registers and memories into other data similarly represented as physical quantities within the device memories or registers or other such information storage, transmission or display devices.

The processes and displays presented herein are not inherently related to any particular device or other apparatus. Various general-purpose systems may be used with programs in accordance with the teachings herein, or it may prove convenient to construct a more specialized apparatus to perform the operations described. The required structure for a variety of these systems will be evident from the description below. In addition, the disclosure is not described with reference to any particular programming language. It will be appreciated that a variety of programming languages may be used to implement the teachings of the disclosure as described herein.

In the foregoing specification, specific exemplary embodiments have been described. It will be evident that various modifications may be made to those embodiments without departing from the broader spirit and scope set forth in the following claims. The specification and drawings are, accordingly, to be regarded in an illustrative sense rather than a restrictive sense.

What is claimed is:

1. A non-transitory machine readable medium storing executable program instructions which when executed by a data processing system cause the data processing system to perform a method, the method comprising:

receiving, by a simulation system executed by the data processing system during design of a physical object using the simulation system, a first data defining a first set of geometry data defining one or more surfaces for modeling the physical object;

generating a first set of mesh data defining a first mesh based on the first set of geometry data, the first mesh including a representation of the one or more surfaces for the physical object, the first set of mesh data associated with a first set of one or more boundary condition properties;

obtaining, by the simulation system executed by the data processing system during design of the physical object using the simulation system, a second data defining a second set of mesh data defining one or more second meshes based on a second set of geometry data representing one or more regions of the physical object, the second set of mesh data associated with a second set of one or more boundary condition properties;

imprinting the one or more second meshes onto one or more locations of the first mesh to model the one or more regions of the physical object, wherein the one or more second meshes are imprinted at the one or more locations to create a combined mesh associated with a combination of the first set of one or more boundary condition properties and the second set of one or more boundary condition properties, the one or more regions where the one or more second meshes are imprinted onto the first mesh correspond with locations of the first mesh that are not defined in the received first set of geometry data, wherein the combined mesh including a first set of facets for a fully overlapped part of the first mesh and a second set of facets for a partially over-lapped part of the first mesh, the first set of facets associated with the second set of one or more boundary condition properties, and the second set of facets asso-ciated with boundary condition properties inherited from the first set of one or more boundary condition properties; and computing, by the data processing system, a first solution to simulate physical properties of the physical object represented by the combined mesh using the combina-tion of the first set of one or more boundary condition properties and the second set of one or more boundary condition properties, the first solution computed for performing a simulation of the design of the physical object to obtain the physical properties of the physical object, the design based at least in part on the combined mesh.

2. The non-transitory machine readable medium as in claim 1, wherein the first mesh and the one or more second meshes are associated with data for use in one or more computational fluid dynamics (CFD) simulations performed by the data processing system.

3. The non-transitory machine readable medium as in claim 2, wherein the second set of geometry data defines holes in the physical object.

4. The non-transitory machine readable medium as in claim 3, wherein applied boundary condition properties in the first set of one or more boundary condition properties and the second set of one or more boundary condition properties are flow properties used in the CFD simulations.

5. The non-transitory machine readable medium as in claim 4, wherein the one or more regions define a pattern of the holes in the physical object.

6. The non-transitory machine readable medium as in claim 5, wherein the method further comprises:

obtaining a third set of geometric data defining one or more third meshes based on the third set of geometric data representing the one or more regions as modified by the third set of geometric data;

imprinting the one or more third meshes onto the first mesh to create a second combined mesh.

7. The non-transitory machine readable medium as in claim 6, wherein the method further comprises: applying the second set of one or more boundary condition properties for each of the imprinted third meshes.

8. The non-transitory machine readable medium as in claim 6, wherein the method further comprises: computing a second solution for physical properties of the physical object represented by the second combined mesh based on the imprinted third meshes.

9. The non-transitory machine readable medium as in claim 7, wherein non-overlapping facets in the first mesh inherit physical properties from the first mesh, and wherein overlapping facets that overlap between the first mesh and the third meshes are derived from the second set of one or more boundary condition properties.

10. The non-transitory machine readable medium as in claim 9, wherein the method further comprises: computing a second solution for physical properties of the physical object represented by the second combined mesh based on the imprinted third meshes.

11. A machine implemented method, the method com-prising:

receiving, by a simulation system executed by a data processing system during design of a physical object using the simulation system, a first data defining a first set of geometry data defining one or more surfaces for modeling the physical object;

generating, by the data processing system, a first set of mesh data defining a first mesh based on the first set of geometry data, the first mesh including a representation of the one or more surfaces for the physical object, the first set of mesh data associated with a first set of one or more boundary condition properties;

obtaining, by the simulation system executed by the data processing system during design of the physical object using the simulation system, a second data defining a second set of mesh data defining one or more second meshes based on a second set of geometry data repre-senting one or more regions of the physical object, the second set of mesh data associated with a second set of one or more boundary condition properties;

imprinting, by the data processing system, the one or more second meshes onto one or more locations of the first mesh to model the one or more regions of the physical object, wherein the one or more second meshes are imprinted at the one or more locations to create a combined mesh associated with a combination of the first set of one or more boundary condition properties and the second set of one or more boundary condition properties, the one or more regions where the one or more second meshes are imprinted onto the first mesh correspond with locations of the first mesh that are not defined in the received first set of geometry data, wherein the combined mesh including a first set of facets for a fully overlapped part of the first mesh and a second set of facets for a partially overlapped part of the first mesh, the first set of facets associated with the second set of one or more boundary condition properties, and the second set of facets associated with boundary condition properties inherited from the first set of one or more boundary condition properties;

computing, by the data processing system, a first solution to simulate physical properties of the physical object represented by the combined mesh using the combination of the first set of one or more boundary condition properties and the second set of one or more boundary condition properties the first solution computed for performing a simulation of the design of the physical object to obtain the physical properties of the physical object, the design based at least in part on the combined mesh.

12. The method as in claim 11, wherein the first mesh and the one or more second meshes are associated with data for use in one or more computational fluid dynamics (CFD) simulations performed by the data processing system.

13. The method as in claim 12, wherein the second set of geometry data defines holes in the physical object.

14. The method as in claim 13, wherein applied boundary condition properties in the first set of one or more boundary condition properties and the second set of one or more boundary condition properties are flow properties used in the CFD simulations.

15. The method as in claim 14, wherein the one or more regions define a pattern of the holes in the physical object.

16. The method as in claim 15, wherein the method further comprises:

obtaining a third set of geometric data defining one or more third meshes based on the third set of geometric data representing the one or more regions as modified by the third set of geometric data;

imprinting the one or more third meshes onto the first mesh to create a second combined mesh.

17. The method as in claim 16, wherein the method further comprises: applying the second set of one or more boundary condition properties for each of the imprinted third meshes.

18. The method as in claim 16, wherein the method further comprises: computing a second solution for physical properties of the physical object represented by the second combined mesh based on the imprinted third meshes.

19. The method as in claim 17, wherein non-overlapping facets in the first mesh inherit physical properties from the first mesh, and wherein overlapping facets that overlap between the first mesh and the third meshes are derived from the second set of one or more boundary condition properties.

20. The method as in claim 19, wherein the method further comprises: computing a second solution for physical properties of the physical object represented by the second combined mesh based on the imprinted third meshes.

* * * * *